US006556934B2

(12) United States Patent
Higashide

(10) Patent No.: US 6,556,934 B2
(45) Date of Patent: Apr. 29, 2003

(54) TIMING CALIBRATION METHOD AND SEMICONDUCTOR DEVICE TESTING APPARATUS HAVING TIMING CALIBRATION FUNCTION

(75) Inventor: Koichi Higashide, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/916,713

(22) Filed: Jul. 26, 2001

(65) Prior Publication Data

US 2002/0013672 A1 Jan. 31, 2002

(30) Foreign Application Priority Data

Jul. 27, 2000 (JP) ........................................ 2000-226900

(51) Int. Cl.[7] .............................................. G01D 18/00
(52) U.S. Cl. ......................................... 702/89; 702/40
(58) Field of Search ........................... 702/89, 119, 117, 702/124, 110, 120, 40; 250/363; 327/266; 375/115; 324/763; 703/13; 364/380; 341/134

(56) References Cited

U.S. PATENT DOCUMENTS 4,653,076 A  * 3/1987 Jerrim et al. ................ 375/115
5,272,344 A  * 12/1993 Williams ................ 250/363.03
5,528,186 A  * 6/1996 Imamura ..................... 327/266

OTHER PUBLICATIONS

Andre Dehon, Feb. 2, 1994 In system timing extraction and control through scan–based, test access ports (http://www.cs.Caltech.edu/research/ic/transit/tn102/tn102.html).*

* cited by examiner

Primary Examiner—John Barlow
Assistant Examiner—Tung S Lau
(74) Attorney, Agent, or Firm—David N. Lathrop, Esq.; Gallagher & Lathrop

(57) ABSTRACT

Signal propagation times TA1, TA2, TA3 . . . of respective pin selection paths of a pin selection device that selectively connects output pins of a semiconductor device testing apparatus to a timing measurement device are measured in advance, and the measured values are memorized. At the time of timing calibration, calibration pulses are transmitted to a timing calibrators via respective test pattern signal transmission paths and respective pin selection paths to measure delay time values T1, T2, T3, - - - of respective channels. The known values TA1, TA2, TA3, - - - are subtracted from the measured values T1, T2, T3, - - - , respectively. A timing calibration is performed by adjusting delay time values of the timing calibrators of the respective test pattern signal transmission paths such that each of the respective differences between the TA1, TA2, TA3, - - - and the measured values T1, T2, T3, - - - become a constant value TC.

4 Claims, 10 Drawing Sheets

TIMING CALIBRATION METHOD AND SEMICONDUCTOR DEVICE TESTING APPARATUS HAVING TIMING CALIBRATION FUNCTION

BACKGROUND OF THE INVENTION

1. Field of the Invention

The present invention relates to a timing calibration method of a semiconductor testing apparatus and also relates to a semiconductor device testing apparatus having the timing calibration function which can test a semiconductor device including memories, logic circuits and the like.

2. Description of the Related Art

FIG. 7 shows a briefly illustrated generally known semiconductor device testing apparatus. The semiconductor device testing apparatus comprises a computer system 10 operating as a controller of the semiconductor device testing apparatus, a pattern generator 11, a pin data selector 12, a waveform formatter group 13, a timing calibrator group 14, a driver group 15, an output pin group 16, a device power supply source 17, a logical comparator 18, a failure analysis memory 19. A semiconductor device under test which is hereinafter referred to as DUT is turned into its operating state upon receipt of a power supply voltage from the device power supply source 17, and test pattern signals (TPS) delivered to the output pin group 16 are supplied to input pins or input/output pins for both signal input and output use of DUT.

The pattern generator 11 outputs test pattern data (TPD) for a plurality of channels. These test pattern data are distributed to the respective input pins as respective pin data for DUT.

The waveform formatter group 13 includes waveform formatters (13-1, 13-2, 13-3, - - - ) the number of which is sufficient to cover the number of channels corresponding to the input pins of DUT. When a plurality of DUTs are simultaneously tested, waveform formatters, the number of which is equal to the number of devices multiplied by the number of channels, are to be provided. Each test pattern data distributed as each pin data is shaped to a test pattern signal (TPS) having a waveform that meets standard requirements (for example, amplitude value) of the semiconductor device to be tested DUT, and this test pattern signal is delivered via the timing calibrator group 14 (14-1, 14-2, 14-3, - - - ) and the driver group 15 (15-1, 15-2, 15-3, - - - ) to the output pin group 16 (P1, P2, P3, - - - ).

Now, hereinafter each signal transmission channel through which each test patter signal is delivered from the waveform formatter, via the timing calibrator and the driver to each output pin, is referred to as a test pattern signal transmission path of each channel of the semiconductor device testing apparatus.

In the case where DUT is a memory, the test pattern signal at the output pin is applied to input terminal of DUT and is written or stored in the memory of DUT. The test pattern signal thus written in DUT is then read out therefrom at its output terminal as output data (OPD) which is in turn compared with an expected value data (EPD) by the logical comparator 18.

When a discordance is detected by the logical comparator 18, an address of the memory at which the discordance is detected, the test pattern by which the discordance is caused, and the like are stored in the failure analysis memory 19, and are utilized in a failure analysis, a failure relief processing, or the like.

Among test items of a semiconductor device to be tested DUT, there is a test for inspecting response characteristics of DUT, which includes, for example, an inspection of a marginal phase range in which DUT can maintain its operable condition by shifting the phase of the test pattern signal to be applied to an input terminal of DUT toward advancing direction or delaying direction from a reference phase position by varying timing of a timing signal generated by a timing generator (although not shown in the drawings), or another inspection of a marginal timing delay in an output timing of the read out data from a timing at which a read command signal is applied to DUT.

When the test of this type is performed, it is necessary that respective signal propagation time values for respective test pattern signal transmission paths each being constituted by a waveform formatter, a tuning calibrator, and a driver should be aligned to have a same constant value. A work for aligning the respective signal propagation time values of respective test pattern signal transmission paths to a constant value is referred to as a timing calibration. In order to perform this timing calibration mode, there is provided a specific arrangement including the timing calibrator group 14, a pin selection device 21, and a timing measurement device 22.

FIG. 8 shows a previously developed testing apparatus within a facility of the Assignee of the present invention which shows a connection state of the testing apparatus in its timing calibration mode, wherein the pin selection device 21 is connected to a group 16 of output pins P1, P2, P3, - - - , and any one of the output pins in their output pin group 16 is selectively connected by the pin selection device 21 to the timing measurement device 22.

As the timing measurement device 22 for use in the timing calibration mode, for example, an oscilloscope or any timing measurement means usually equipped in a semiconductor device testing apparatus of this type can be used.

In the timing calibration mode of the testing apparatus as shown in FIG. 8, the pattern generator 11 generates a timing calibration pulse data, TPD which is designed to form a timing calibration pulse PT having a predetermined constant duration period at the respective waveform formatters.

The pin data selector 12 distributes the timing calibration pulse data TPD, from the pattern generator to the respective waveform formatters (13-1, 13-2, - - - ), so that the timing calibration pulse (PT) is generated by each of the respective waveform formatters and is transmitted through respective test pattern signal transmission paths to the respective output pins (P1, P2, - - - ), respectively.

Now assuming one of the output pins, for example, P1 in FIG. 8 as a reference output pin.

The timing calibration pulse signals (PT) having the constant duration period as shown in FIG. 9 is transmitted to the predetermined reference output pin, P1 in FIG. 8 via a reference test pattern signal transmission path which is composed of a series connection circuit of a waveform formatter 13-1, a timing calibrator 14-1, and a driver 15-1, and is then selectively transmitted to the timing measurement device 22 by a pin selection device 21.

FIG. 10 shows an example of internal circuit structure of the pin selection device 21. In this example, there is shown a case of circuit structure in which the reference output pin P1 of the output pin group 16 can be connected to the output terminal TOU by switching operations of relay switches RS1-1 through RS4-1. In the example of FIG. 10, there is shown a state that the relay switches RS1-1, RS 2-1, RS3-1 and RS4-1 are connected to a contact side (a), which is referred to as a pin selection path for the reference output pin P1 in the pin selection device 21.

In the case of using an oscilloscope as the timing measurement device 22, a rising timing of the thus transmitted timing calibration pulse PT is measured using a scale on the lateral X axis that is a time axis on the display screen (OSD) of the oscilloscope, and that scale position is determined as a reference phase position (RPP). (See FIG. 9) The timing calibration pulses (PT) are transmitted to the respective remaining output pins P2, P3, - - - via the corresponding test pattern signal transmission paths and also selectively connected one after another to the oscilloscope. The corresponding delay time values of the timing calibrators 14-2, 14-3, - - - in the respective test pattern signal transmission paths for the remaining output pins P2, P3, - - - other than the reference output pin P1 are adjusted to perform the timing calibration such that a rising timing of the outputted pulse sequence at each one of the remaining output pins is accorded with the reference phase position (RPP).

The characteristic of this pin selection device 21 is that a consideration is made such that whenever any one of the output pins P1–P16 is selected, the line length of the pin selection path from each of the output pins P1–P16 to the output terminal TOU should become equal to each other, and hence even if any one of the output pins P1–P16 is selected, the delay time value in the pin selection device is equal to a constant value.

Moreover, signal conductors in the pin selection device 21 are formed by printed wiring, and is constructed in microstrip-line structure so that specific characteristic impedance can be obtained in order to especially prevent a waveform of a high-speed pulse signal from being deteriorated.

However, it is difficult to make all of the signal propagation delay time values of those pin selection paths equal to a constant value, and in reality, a slight difference in delay time value might inevitably occurs between the pin selection paths.

If it is assumed that a difference in the delay time value might exist between the pin selection paths in the pin selection device 21, this time difference is erroneously added to or included into the timing calibration value which is determined by and set forth in the timing calibrators 14 when the timing calibration is completed. Hence, in this case, there is a drawback that the internal difference in the delay time values of the pin selection paths of the pin selection device 21 is summed as a timing error into the timing calibration value.

FIG. 11 shows the above stated drawback. In FIG. 11, a reference sign TS represents a constant delay time value to which the respective delay time values of the respective channels are to be adjusted equally. As assumed before, the respective pin selection paths for the respective output pins have their delay time values (TA-1, TA-2, TA-3, - - -) which are slightly different from each other.

In the calibration mode, however, the delay time values of the respective remaining channel are adjusted to be equal to the constant time TS by adjusting the respective calibrators 14-1, 14-2, 14-3, - - -.

As it is seen in FIG. 11, within the constant time length TS, the breakdowns of the delay time values of respective channels are sums of corresponding delay time values (TX1, TX2, TX3, - - -) caused by the respective signal transmission paths of the semiconductor device testing apparatus and corresponding delay time values (TA1, TA2, TA3, - - -) (hatched portions) caused by the respective pin selection paths in the pin selection device 21. If the delay time values TA2, TA3 . . . caused by the respective pin selection paths for the remaining output pins P2, P3, - - - in the pin selection device 21 are either longer or shorter than that (TA-1) of the reference pin selection path, time differences caused by delay time value dispersion of the respective pin selection paths in the pin selection device 21 are reflected in the delay time values (TX2, TX3, - - -) caused by the respective test pattern signal transmission paths for the remaining output pins.

Therefore, in the state that the pin selection device 21 is detached after the timing calibration, the delay time values (TX1, TX2, TX3, - - -) caused by the respective test pattern signal transmission paths include the delay time value differences of the pin selection device 21 respectively, and hence it can hardly be said that the timing calibration is correctly performed.

Further, as the pin selection device 21, in addition to the configuration shown in FIG. 10, there may be another pin selection device having a structure wherein a probe is utilized which is movable in X-Y-Z orthogonal directions by an X-Y-Z orthogonal driving mechanism, and an input terminal of the timing measurement device 22 is connected to the output pin group 16 by the probe. Even in the pin selection device having this structure, when the probe is moved in X-Y-Z directions, the curvature of the cable (coaxial cable) connecting the probe to the timing measurement device changes. There occurs a phenomenon that the delay time value of the cable is changed due to the change of the curvature, and hence there is a problem similar to that of the case described above.

SUMMARY OF THE INVENTION

It is an object of the present invention to propose a timing calibration method of a semiconductor device testing apparatus by which the problem described above is solved and the signal propagation delay time value differences in the pin selection device 21 are not reflected as errors in the timing calibration of the semiconductor device testing apparatus, and to propose the semiconductor device testing apparatus that has an arrangement on board for materializing this calibration method.

In order to achieve the above object, in the first aspect of the present invention, there is proposed a timing calibration method for a semiconductor device testing apparatus comprising a plurality of test pattern signal transmission paths through which test pattern signals are transmitted to output pins and testing a semiconductor device under test using the thus transmitted test pattern signals, wherein the timing calibration method comprises the steps of: selectively connecting the respective output pins one after another to a timing measurement device through respective pin selection paths which are provided to correspond to the output pins, respectively; measuring by means of the timing measurement device signal propagation delay time values through the respective pin selection paths and storing the measured values in a memory; measuring by means of the timing measurement device total signal propagation delay time values through respective series connections each of which is constituted of one of the test pattern signal transmission paths and one of the pin selection paths corresponding to the respective output pins; subtracting the memorized values of the respective pin selection paths from the corresponding total signal propagation delay time values to thereby obtain difference delay time values; and adjusting delay time values of timing calibrators in the respective test pattern signal transmission paths such that those respective difference delay time values corresponding to all the output pins accord with a predetermined value whereby calibrating difference in signal propagation delay time values of the respective test pattern signal transmission paths.

In the second aspect of the present invention, there is proposed a timing calibration method in a semiconductor device testing apparatus comprising a plurality of test pattern signal transmission paths through which test pattern signals are transmitted to output pins and testing a semiconductor device under test using the thus transmitted test pattern signals, wherein the timing calibration method comprises the steps of: selectively connecting the respective output pins one after another to a timing measurement device through respective pin selection paths which are provided to correspond to the output pins, respectively; measuring by means of the timing measurement device signal propagation delay time values through the respective pin selection paths and storing the measured values in a memory; determining one of the output pins as a reference output pin and calculating deviation values between the delay time value as a reference value through the pin selection path for the reference output pin and respective delay time values through remaining pin selection paths for remaining output pins other than the reference output pin; measuring by means of the timing measurement device total signal propagation delay time vales through respective series connections each of which is constituted of one of the test pattern signal transmission paths and one of the pin selection paths; calculating deviation values between the total signal propagation delay time value for the reference output pin and the respective total signal propagation delay time values; and adjusting signal propagation delay time values of timing calibrators in the respective test pattern signal transmission paths for the remaining output pins such that those deviation values of the total delay time values for the respective remaining output pins accord with the corresponding deviation values, respectively whereby calibrating difference in signal propagation delay time values of the respective test pattern signal transmission paths.

In the third aspect of the present invention, there is proposed a semiconductor device testing apparatus having a timing calibration mode comprising: a pattern generator; a pin data selector distributing pin data including test pattern data, address signals and control signals, and outputted from the pattern generator to respective pin channels corresponding to output pins waveform formatters each shaping from the pin data distributed thereto by the pin data selector a test pattern signal having a waveform that meets standard requirements of a semiconductor device under test; timing calibrators calibrating signal propagation delay time values through respective rest pattern signal transmission paths connected to the respective waveform formatters; drivers transmitting the test pattern signals outputted from the respective timing calibrators to the output pins to which a semiconductor device under test is coupled; a computer system controlling operations of the testing apparatus; a timing measurement device measuring applied timings of the test pattern signals applied to the respective output pins; and a pin selection device connected to the output pins in a timing calibration mode and forming pin selection paths which selectively connect the respective output pins one by one to the timing measurement device; wherein said computer system comprises: memory means for storing therein signal propagation delay time values through the respective pin selection paths; subtraction means for subtracting the stored delay time values through the respective pin selection paths from corresponding total delay time values measured by means of the timing measurement device through respective series connections of the test pattern signal transmission paths and the pin selection paths corresponding to the respective output pins; and timing control means for controlling the signal propagation delay time values of the respective timing calibrators such that difference delay time values obtained as results of the subtraction means are converged to a predetermined constant value.

In the fourth aspect of the present invention, there is provided a semiconductor device testing apparatus having a timing calibration mode comprising: a pattern generator; a pin data selector distributing pin data including test pattern data, address signals and control signals, and outputted from the pattern generator to respective pin channels corresponding to output pins; waveform formatters each shaping from the pin data distributed thereto by the pin data selector a test pattern signal having a waveform that meets standard requirements of a semiconductor device under test; timing calibrators calibrating signal propagation delay time values through respective rest pattern signal transmission paths connected to the respective waveform formatters; drivers transmitting the test pattern signals outputted from the respective timing calibrators to the output pins to which a semiconductor device under test is coupled; a computer system controlling operations of the testing apparatus; a timing measurement device measuring applied timings of the test pattern signals applied to the respective output pins; and a pin selection device connected to the output pins in a timing calibration mode and forming pin selection paths which selectively connect the respective output pins one by one to the timing measurement device; wherein said computer system comprises: memory means for storing therein signal propagation delay time values through the respective pin selection paths; calculation means for calculating deviation values between the stored delay time value of the pin selection path stored in the memory means for one of the output pins which is determined as a reference output pin and the respective delay time values of the pin selection paths stored in the memory means for remaining output pins other than the reference output pin; and timing control means for controlling the delay time values of the respective timing calibrator such that deviation values between the total signal propagation delay time value for the reference output pin and the respective total signal propagation delay time values for the remaining output pins accord with the corresponding deviation values, respectively, whereby calibrating difference in signal propagation delay time values of the respective test pattern signal transmission paths.

DETAILED DESCRIPTION OF THE INVENTION

Figure 1:
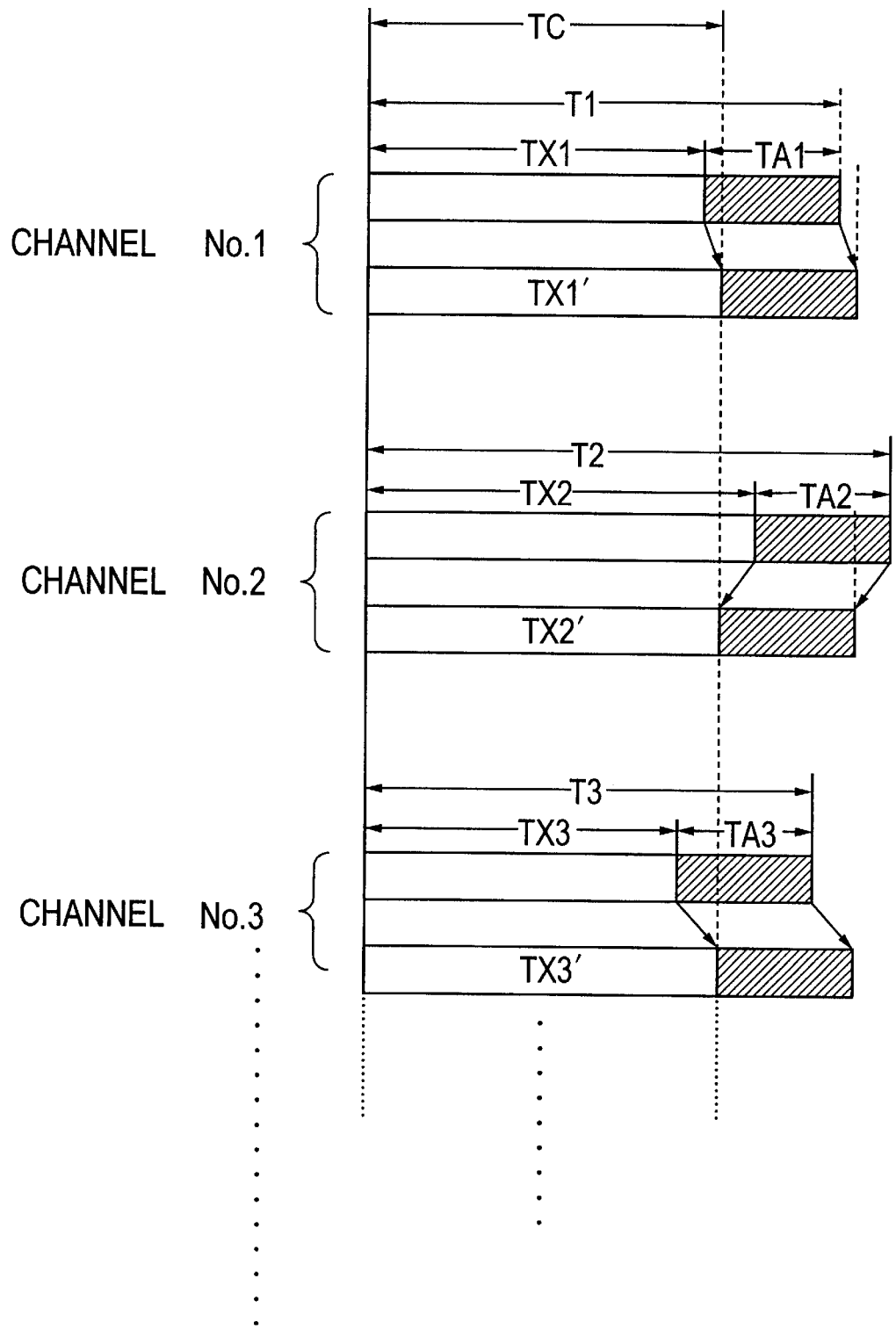
FIG. 1 is a diagram for explaining a timing calibration method proposed in the first aspect of the present invention.

FIG. 1 shows a timing calibration method proposed in the first aspect of the present invention. Further, in each of the drawings, an element to which the same reference sign or the same reference numeral is affixed indicates the same element.

In FIG. 1, a reference sign TC represents a delay time length targeted for each of test pattern signal transmission paths. Here, this is referred to as a calibration target value.

Reference signs TA1, TA2, TA3, - - - represent delay times of respective pin selection paths of a pin selection device 21. In the present invention, those delay times (TA1, TA2, TA3, - - -) are measured in advance, and the measured values are stored in, for example, a memory of a computer system for controlling a semiconductor device testing apparatus. Those stored delay time values are read out from the memory when a timing calibration program is activated, and are given as known time values.

Reference signs T1, T2, T3, - - - represent measured values of delay times of channel No. 1, channel No. 2, channel No. 3 - - -, respectively. The breakdowns of the respective measured values of those delay times are sums of the corresponding delay time values (TA1, TA2, TA3, - - -) of respective pin selection paths of the pin selection device 21 that has known values and the corresponding delay time values (TX1, TX2, TX3, - - -) caused by the respective signal transmission paths of the semiconductor device testing apparatus.

In the timing calibration method proposed in the first aspect of the present invention, the known values (TA1, TA2, TA3, - - -) are subtracted from the measured delay time values (T1, T2, T3, - - -), respectively. If each of the difference values (TX1, TX2, TX3, - - -) accords with the target value TC (TX1=TC, TX2=TC, TX3=TC, - - -), the value is maintained as it is. If each of the difference values does not accord with the target value TC (TX1≠TC, TX2≠TC, TX3≠TC, - - -), the delay times of the respective channels NO. 1, No.2, No.3 . . . of the timing calibrator group 14 are adjusted such that the relations of TX1=TC, TX2=TC, TX3=TC, - - - are obtained. Thus, the timing calibration is performed.

Figure 2:
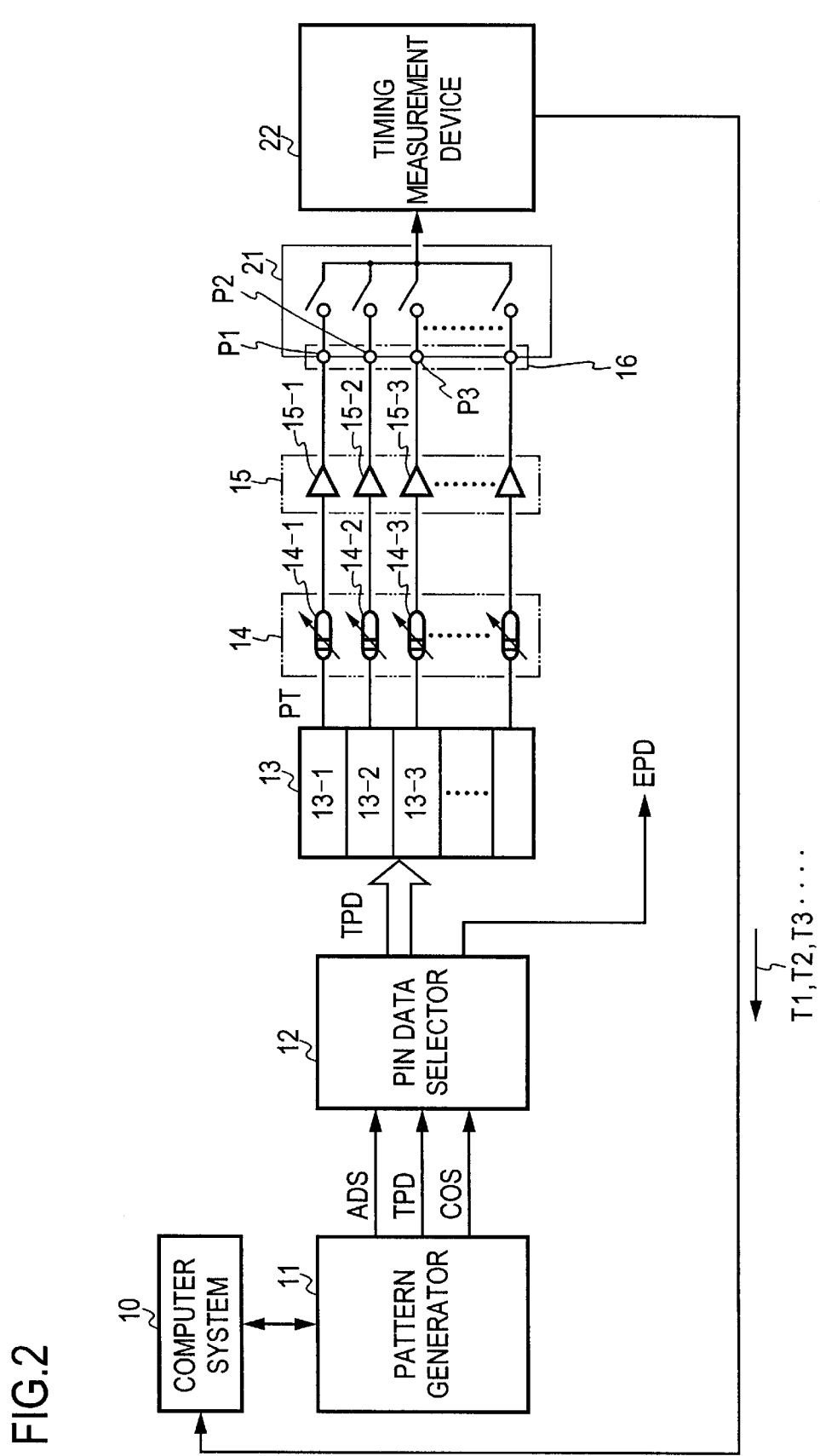
FIG. 2 is a block diagram for explaining an embodiment of a semiconductor device testing apparatus by which the timing calibration method proposed in the first aspect of the present invention is materialized.

In order to perform this process, as shown in FIG. 2, the timing measurement device 22 has a function to transfer, when the measured delay time values (T1, T2, T3, - - -) are measured, the measured delay time values (T1, T2, T3, - - -) to the computer system 10. In addition, the computer system 10 performs a calculation process to subtract the delay times TA1, TA2, TA3 . . . of the pin selection device 21 that are memorized in the channel by channel basis from the transferred measured delay time values (T1, T2, T3, - - -), respectively. If each of the difference values (TX1, TX2, TX3, - - -) does not accord with the target value TC, the computer system controls the delay times of corresponding variable delay elements of the timing calibrator group 14 to perform the timing calibration so that the values (TX1, TX2, TX3, - - -) respectively become TX1', TX2', TX3', - - - each according with the target value TC. This timing calibration process is automatically executed when the computer system executes the timing calibration program.

When the delay time value differences (TX1, TX2, TX3, - - -) of all the channels are set to the respective delay time values (TX1', TX2', TX3', - - -) each according with the target value TC, all the delay times of the pattern signal transmission paths of the semiconductor device testing apparatus are adjusted to the calibration target value TC.

Figure 3:
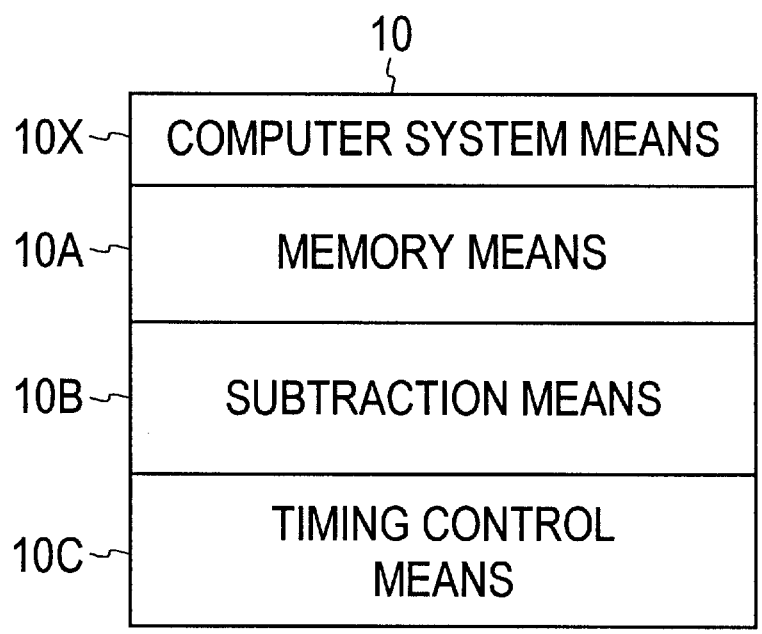
FIG. 3 is a block diagram for explaining an arrangement of an essential portion of the semiconductor device testing apparatus shown in FIG. 2.

FIG. 3 shows an arrangement newly provided in the computer system 10 in order to materialize the aforementioned timing calibration method. Although not illustrated, the computer system 10 is conventionally equipped with a test program for executing a test, a timing calibration program for executing a timing calibration process, and the like.

The present invention is characterized in the arrangement in which a memory 10A, subtract means 10B and timing control means 10C are added to the computer system 10 in addition to those programs.

The aforementioned delay time values (TA1, TA2, TA3, - - -) of the respective pin selection paths of the pin selection device 21 are stored in the memory 10A. In addition, the subtract means 10B respectively subtracts the delay time values (TA1, TA2, TA3, - - -) of the pin selection device 21 from the delay time values (T1, T2, T3, - - -) measured in the channel by channel basis to perform calculation processes TX1=(T1−TA1), TX2=(T2−TA2), TX3=(T3−TA3).

The timing control means 10C controls the respective delay times of the timing calibrator group 14 so that each of the subtracted results (TX1, TX2, TX3, - - -) accords with the target value TC.

Figure 4:
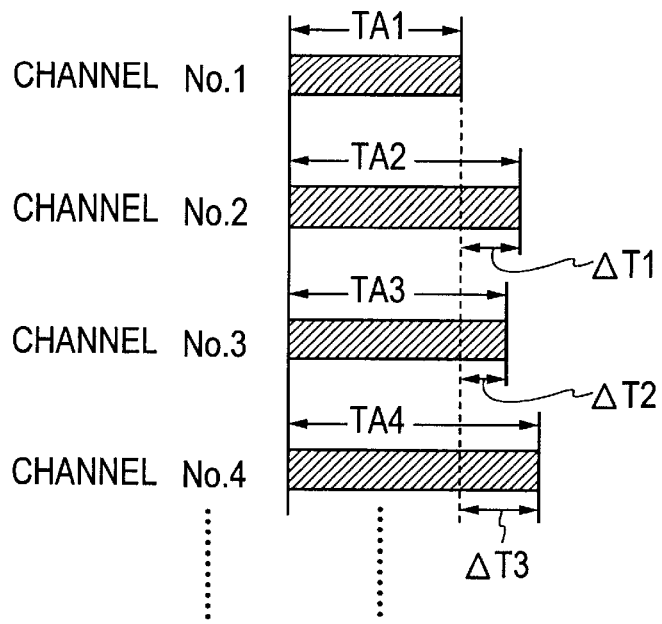
FIGS. 4 and 5 are diagrams for explaining the timing calibration method proposed in the second aspect of the present invention.

The timing calibration method proposed in the second aspect of the present invention will be explained using FIGS. 4 and 5. In the second aspect of the present invention, the delay time values (TA1, TA2, TA3, - - -) of the respective pin selection paths of the pin selection device 21 are measured, and the measured results are stored in the memory of the computer system 10. At the same time, one of the channels is determined as a reference channel, and deviation values (ΔT1, ΔT2, ΔT3, - - -) between the delay time of the pin selection path of that channel and the delay times of the pin selection paths of the other channels are obtained and stored in the memory. In the example shown in FIG. 4, the channel No. 1 is determined as the reference channel. FIG. 4 shows a case in which differences between the delay time of the pin selection path of the channel No. 1 as a reference value and the delay times of the pin selection paths of the other channels are determined to be the deviation values (ΔT1, ΔT2, ΔT3, - - -).

Figure 5:
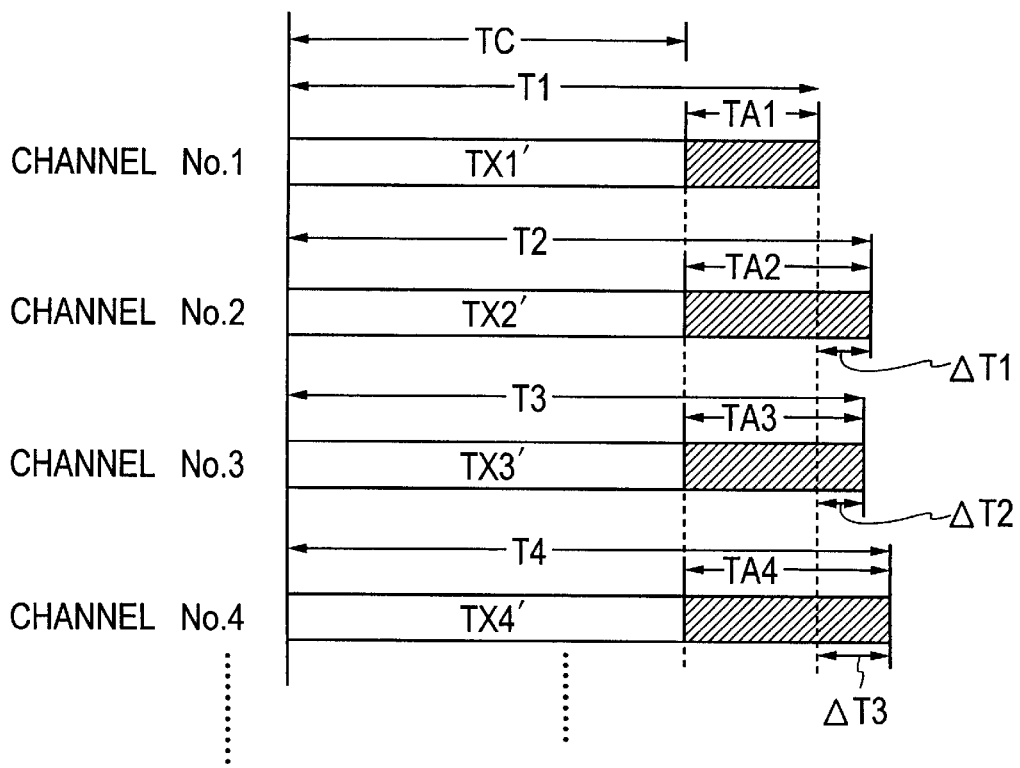

At the time of timing calibration, if the delay times of the timing calibrator group 14 are adjusted such that differences between the delay time values (T1, T2, T3, T4, - - -) of the respective channels measured by the timing measurement device 22 {as mentioned above, those are sums of the delay time values (TX1, TX2, TX3, TX4, - - -) of the signal transmission paths of the respective channels of the semiconductor device testing apparatus and the corresponding delay time values (TA1, TA2, TA3, TA4, - - -) of the pin selection paths of the pin selection device} and the delay time value T1 of the reference channel should become the aforementioned deviation values (0, ΔT1, ΔT2, ΔT3, - - -), as shown in FIG. 5, each of the adjusted delay time values (TX1', TX2', TX3', TX4', - - -) of the respective pattern signal transmission paths in the semiconductor device testing apparatus side accords with the constant target value TC.

Figure 6:
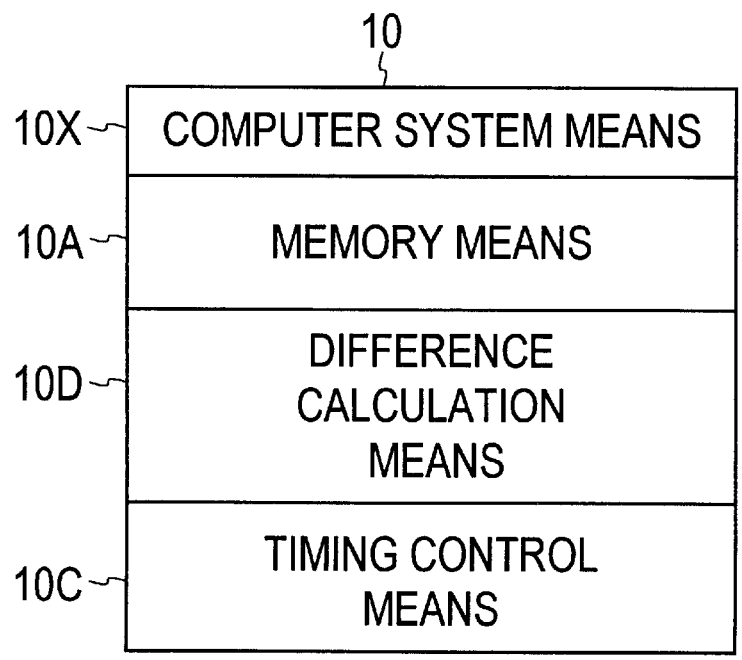
FIG. 6 is a block diagram for explaining an arrangement of an essential portion of the semiconductor device testing apparatus by which the timing calibration method proposed in the second aspect of the present invention is materialized.
Figure 7:
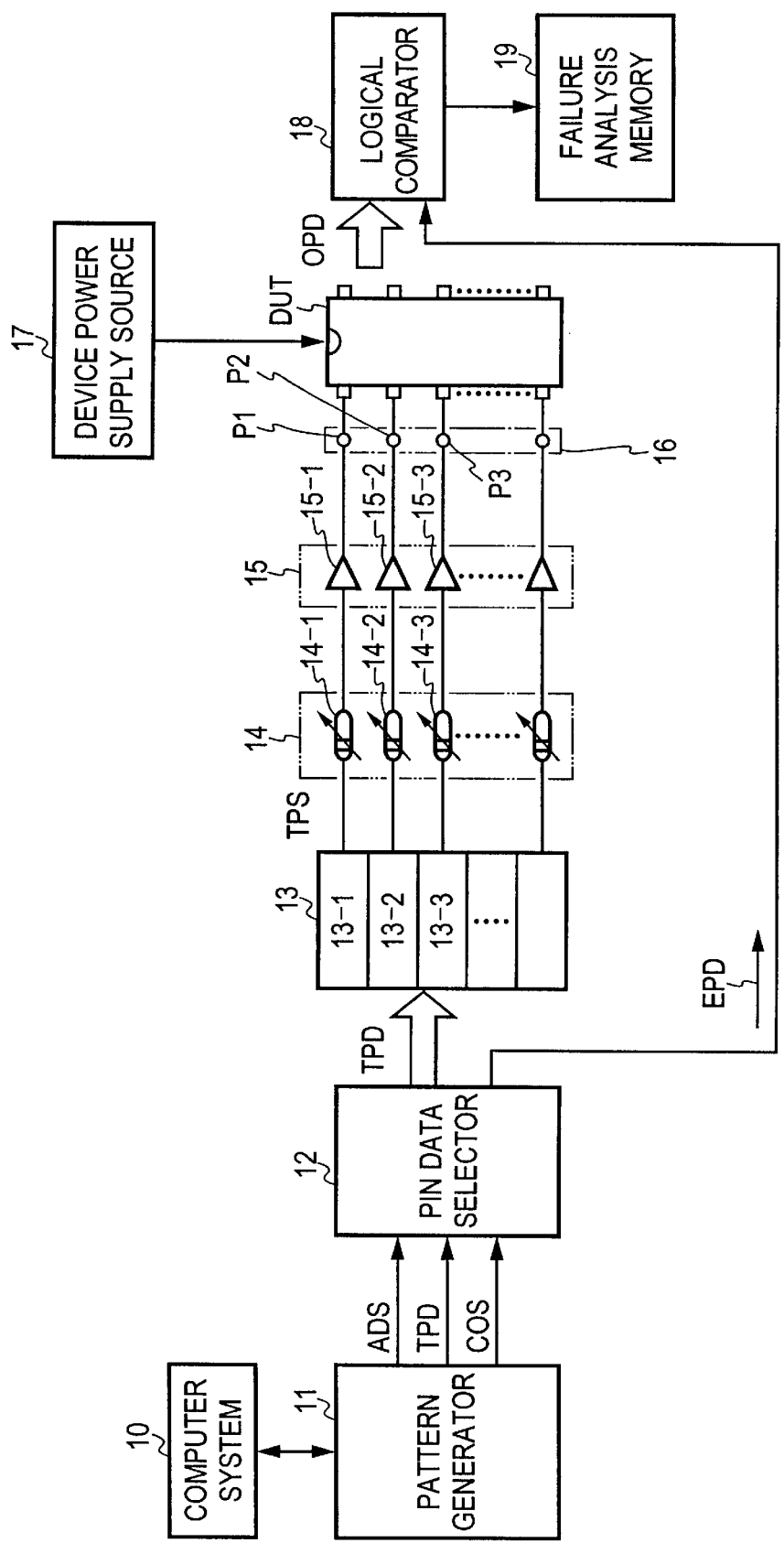
FIG. 7 is a block diagram for explaining a semiconductor device testing apparatus that has conventionally been used.
Figure 8:
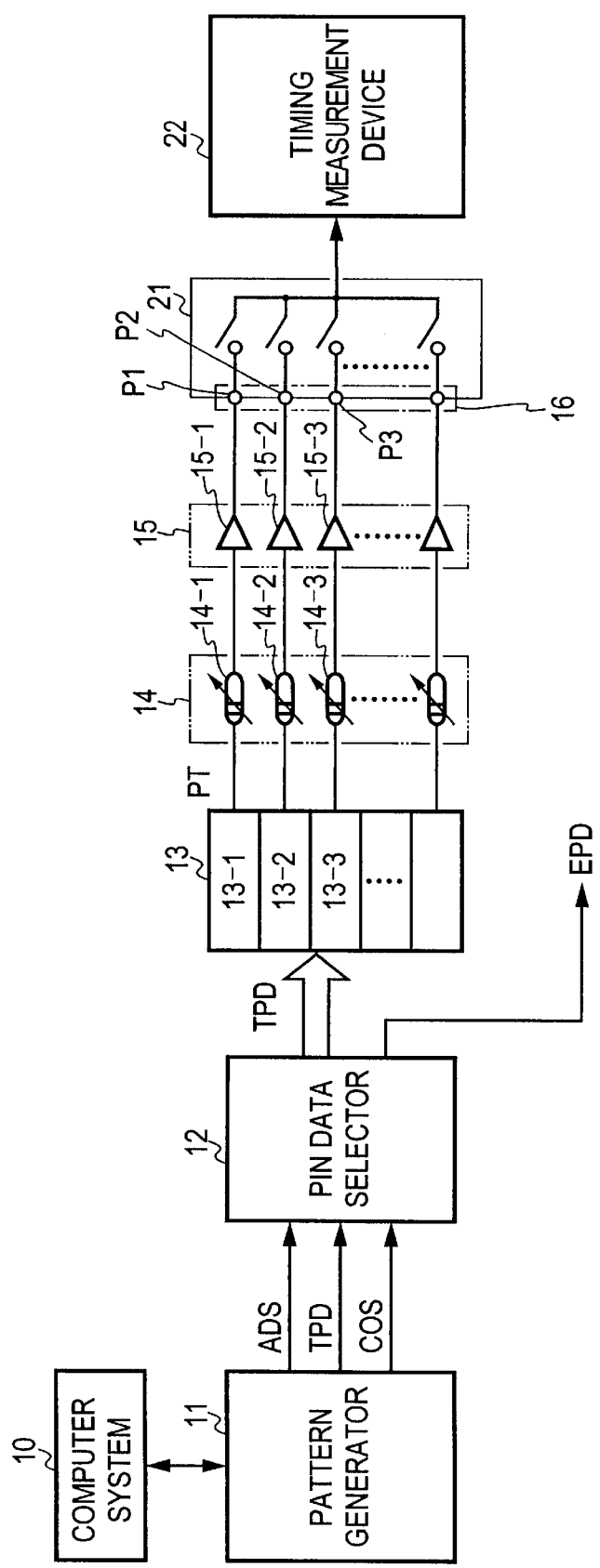
FIG. 8 is a block diagram for explaining a semiconductor testing apparatus for performing timing calibration method which has been previously developed within the Assignee's facility.
Figure 9:
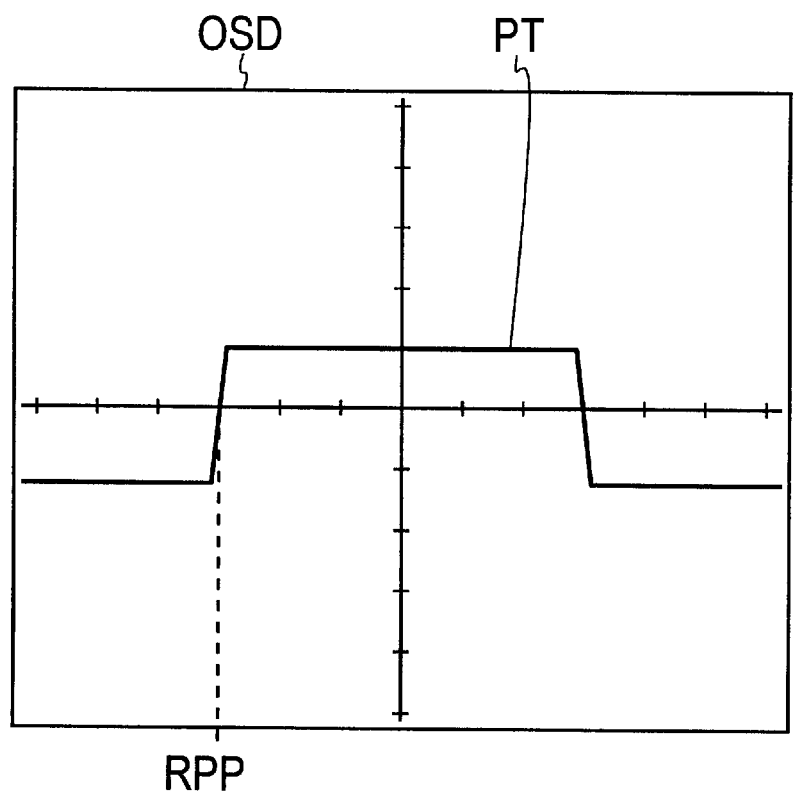
FIG. 9 is a display screen diagram for explaining an example of a timing measurement device that was used in the semiconductor device testing apparatus for performing timing calibration which has been previously developed within the Assignee's facility as shown in FIG. 8.
Figure 10:
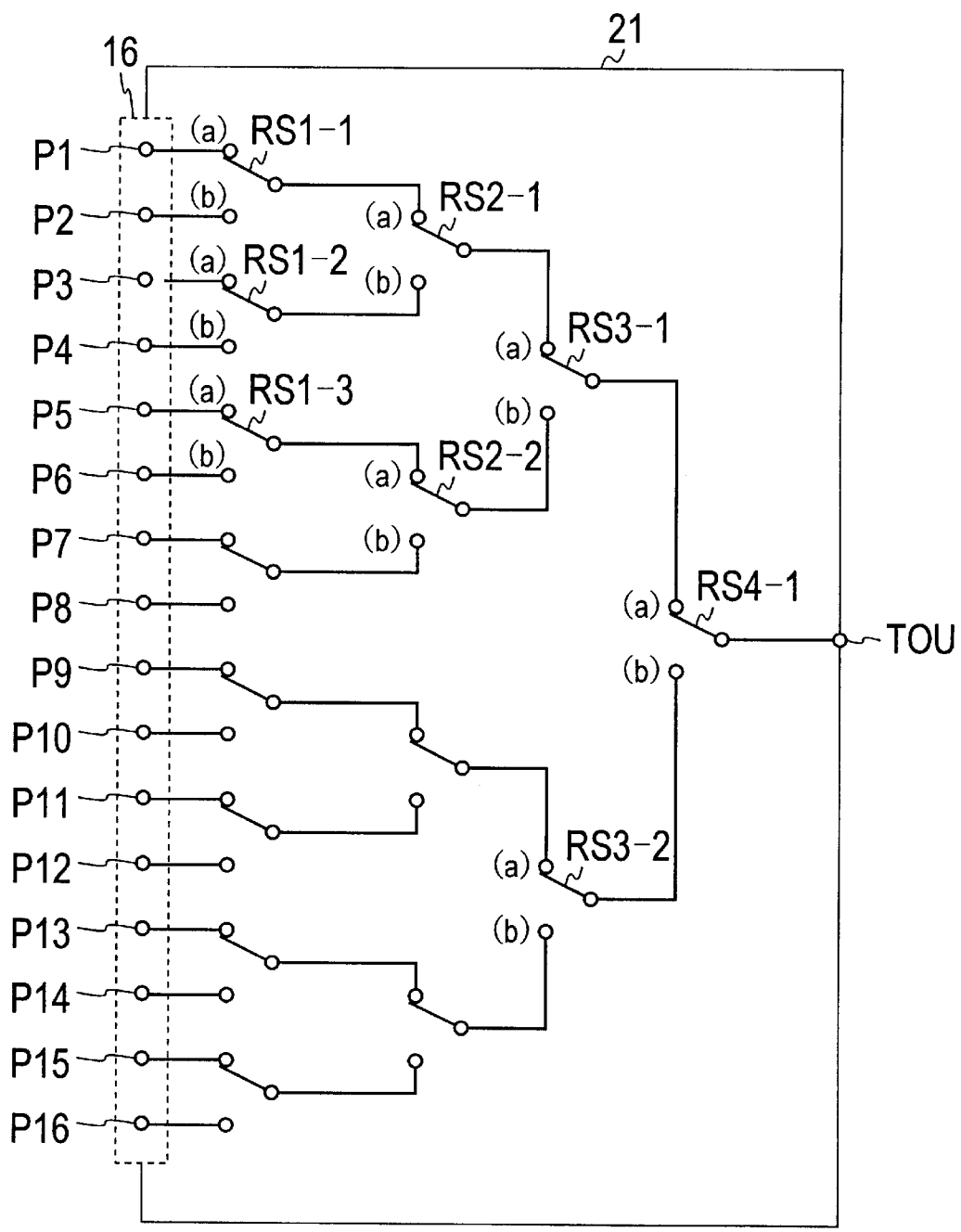
FIG. 10 is a connection diagram for explaining an example of internal arrangement of a pin selection device shown in FIG. 8.
Figure 11:
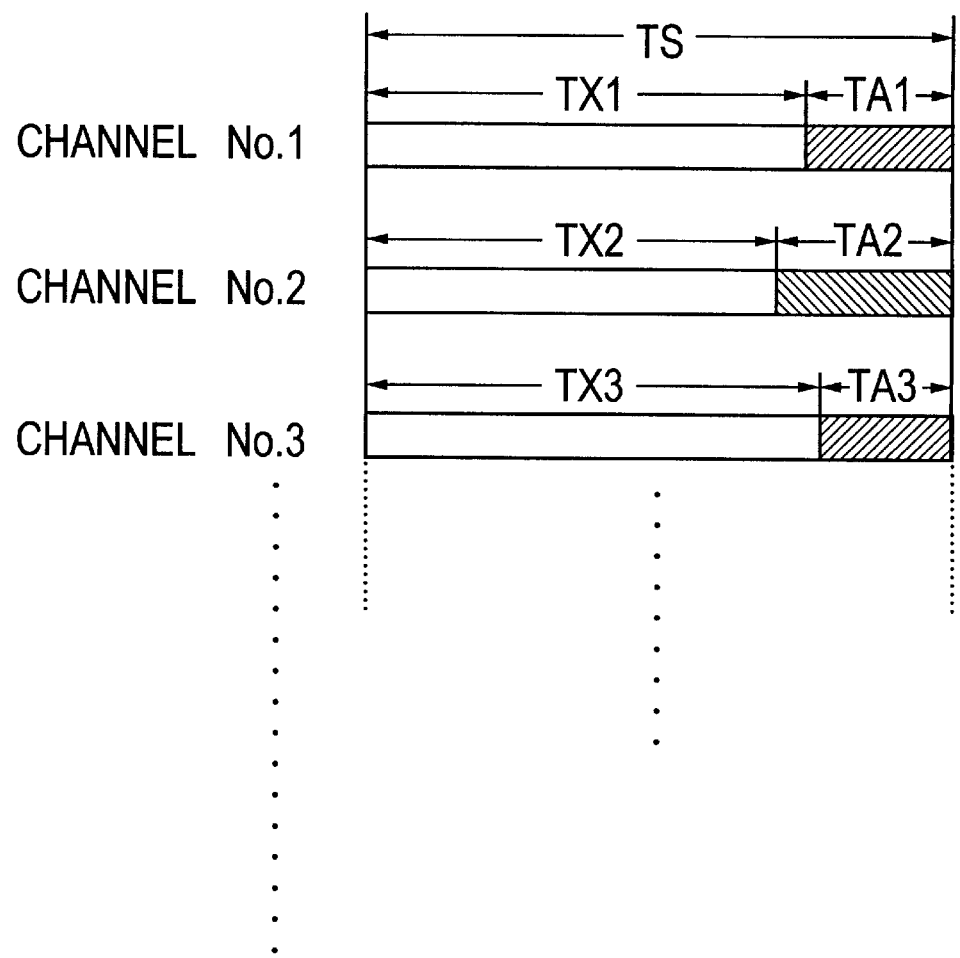
FIG. 11 is a diagram for explaining a drawback of the previously developed arrangement shown in FIG. 8.

For this reason, as shown in FIG. 6, in addition to the memory 10A for storing therein the delay time values (TA1, TA2, TA3, - - -) of the pin selection paths in the pin selection device 21, there are provided in the computer system 10: deviation value calculating means 10D by which, for example, the TA1 among the delay time values (TA1, TA2, TA3, - - -) stored in this memory 10A is used as a reference value, and the respective deviation values (ΔT1, ΔT2, ΔT3, - - -) between the reference value TA1 and the other delay time values are calculated; and timing control means 10C for controlling the delay time values of the timing calibrator group 14 such that the respective time differences between the measured delay time values (T1, T2, T3, - - -) sent from the timing measurement device 22 and the measured delay time value of the reference channel respectively accord with the corresponding deviation values (ΔT1, ΔT2, ΔT3, - - -) calculated by the deviation value calculating means 10D.

As explained above, according to the present invention, the deviation delay time values of the pin selection paths of the pin selection device 21 used at the time of timing calibration process can be prevented from being reflected in the timing calibration result, and hence each of the delay time values of the test pattern transmission paths can be made a constant value.

As a result, there is obtained an advantage that the timing calibration accuracy of the semiconductor device testing apparatus can be increased, and the reliability of the test results of the semiconductor device testing apparatus can be increased.

What is claimed is:

1. A timing calibration method in a semiconductor device testing apparatus comprising a plurality of test pattern signal transmission paths through which test pattern signals are transmitted to output pins and testing a semiconductor device under test using the thus transmitted test pattern signals, said timing calibration method comprising the steps of:
selectively connecting the respective output pins one after another to a timing measurement device through respective pin selection paths which are provided to correspond to the output pins, respectively;
measuring by means of the timing measurement device signal propagation delay time values through the respective pin selection paths and storing the measured values in a memory;
measuring by means of the timing measurement device total signal propagation delay time values through respective series connections each of which is constituted of one of the test pattern signal transmission paths and one of the pin selection paths corresponding to the respective output pins;
subtracting the memorized values of the respective pin selection paths from the corresponding total signal propagation delay time values to thereby obtain difference delay time values; and
adjusting delay time values of timing calibrators in the respective test pattern signal transmission paths such that those respective difference delay time values corresponding to all the output pins accord with a predetermined value thereby calibrating differences in signal propagation delay time values of the respective test pattern signal transmission paths.

2. A timing calibration method in a semiconductor device testing apparatus comprising a plurality of test pattern signal transmission paths through which test pattern signals are transmitted to output pins and testing a semiconductor device under test using the thus transmitted test pattern signals, said timing calibration method comprising the steps of:
selectively connecting the respective output pins one after another to a timing measurement device through respective pin selection paths which are provided to correspond to the output pins, respectively;
measuring by means of the timing measurement device signal propagation delay time values through the respective pin selection paths and storing the measured values in a memory;
determining one of the output pins as a reference output pin and calculating deviation values between the delay time value as a reference value through the pin selection path for the reference output pin and respective delay time values through remaining pin selection paths for remaining output pins other than the reference output pin;
measuring by means of the timing measurement device total signal propagation delay time vales through respective series connections each of which is constituted of one of the test pattern signal transmission paths and one of the pin selection paths
calculating deviation values between the total signal propagation delay time value for the reference output pin and the respective total signal propagation delay time values; and
adjusting signal propagation delay time values of timing calibrators in the respective test pattern signal transmission paths for the remaining output pins such that those deviation values of the total delay time values for the respective remaining output pins accord with the corresponding deviation values, respectively, thereby calibrating differences in signal propagation delay time values of the respective test pattern signal transmission paths.

3. A semiconductor device testing apparatus wherein a semiconductor device under test coupled to output pins is tested by using test pattern signals transmitted to the output pins, said testing apparatus comprising:
a plurality of test pattern signal transmission paths each constituted of a series connection of a waveform formatter, a timing calibrator, a driver and one of the output pins, respectively,
a computer system controlling operations of the testing apparatus;
a timing measurement device used for timing calibration mode; and
a pin selection device used for timing calibration mode and forming pin selection paths which selectively connect the output pins one by one to the timing measurement device, wherein
said timing measurement device measures total signal propagation delay time values (T1, T2, - - -) of timing calibration pulse signals transmitted through respective series connections of one of the respective signal transmission paths and one of the respective pin selection paths for the respective output pins, said computer system includes:

memory means for storing therein delay time values (TA1, TA2, - - -) of the timing calibration pulse signal transmitted through the respective pin selection paths;

subtract means for subtracting the stored delay time values (TA1, TA2, - - -) through the respective pin selection paths stored in the memory means from the corresponding measured total delay time values (T1, T2, - - -) through the respective pin channels; and timing control means for controlling the delay time values of respective timing calibrators such that difference delay time values (TX1, TX2, - - -) for the respective output pins obtained as results of the subtract means are converged to a same predetermined constant value (TX1', TX2', - - -,= TC).

4. A semiconductor device testing apparatus wherein a semiconductor device under test coupled to output pins is tested by using test pattern signals transmitted to the output pins, said testing apparatus comprising:

a plurality of test pattern signal transmission paths each constituted of a series connection of a waveform formatter, a timing calibrator, a driver and one of the output pins, respectively, a computer system controlling operations of the testing apparatus;

a timing measurement device used for timing calibration mode; and a pin selection device used for timing calibration mode and forming pin selection paths which selectively connect the output pins one by one to the timing measurement device, wherein said timing measurement device measures total signal propagation delay time values (T1, T2, - - -) of timing calibration pulse signals transmitted through respective series connections of one of the respective signal transmission paths and one of the respective pin selection paths for the respective output pins, said computer system includes:

memory means for storing therein delay time values (TA1, TA2, - - -) of the timing calibration pulse signal transmitted through the respective pin selection paths;

calculation means for calculating deviation values (ΔT1, ΔT2, - - -) between the stored delay time value (TA1) for one of the output pins determined as a reference output pin and respective stored delay time values (TA2, TA3, - - -) through remaining pin selection paths for the remaining output pins other than the reference output pin; and timing control means for adjusting delay time values of the respective timing calibrators such that those respective deviation delay time values (T2−T1, T3−T1, - - -) between the total signal propagation delay time value (T1) through a total signal path which is constituted of a series connection of the test pattern signal transmission path and the pin selection path for the reference output pin and the respective total signal propagation delay time values (T2, T3, - - -) through respective total signal paths which are constituted of series connections of the test pattern signal transmission paths and the pin selection paths for remaining output pins other than the reference output pin, accord with the corresponding deviation delay time values (ΔT1=T2−T1, ΔT2=T3−T1, - - -) through the respective pin selection paths for the remaining output pins, respectively.

\* \* \* \* \*